United States Patent
Berardinelli et al.

(10) Patent No.: US 6,259,608 B1
(45) Date of Patent: Jul. 10, 2001

(54) CONDUCTOR PATTERN FOR SURFACE MOUNT DEVICES AND METHOD THEREFOR

(75) Inventors: Carl Frederick Berardinelli, Russiaville, IN (US); Thomas M. Otto, Brookfield, WI (US); Galen J. Reeder, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/286,324

(22) Filed: Apr. 5, 1999

(51) Int. Cl.[7] ........................................ H05K 7/06
(52) U.S. Cl. ................ 361/777; 361/779; 174/250; 174/260; 257/778; 257/786; 228/180.22; 29/840; 438/108
(58) Field of Search .................... 361/768, 774, 361/777, 779; 257/737, 738, 775, 778, 786; 174/250, 253, 260, 261; 438/108; 29/840, 843; 228/180.21, 180.22

(56) References Cited

U.S. PATENT DOCUMENTS

| | | | | |
|---|---|---|---|---|
| 3,429,040 | * | 2/1969 | Miller | 257/778 |
| 3,517,279 | * | 6/1970 | Ikeda et al. | 257/778 |
| 3,770,874 | * | 11/1973 | Krieger et al. | 174/260 |
| 3,887,760 | * | 6/1975 | Krieger et al. | 174/261 |
| 4,034,467 | * | 7/1977 | Sapunarow et al. | 174/261 |
| 4,164,778 | * | 8/1979 | Sawairi et al. | 361/777 |
| 4,893,216 | * | 1/1990 | Hagner | 361/774 |
| 5,192,835 | * | 3/1993 | Bull et al. | 174/260 |
| 5,225,634 | * | 7/1993 | Petroz | 174/250 |
| 5,613,033 | * | 3/1997 | Swamy et al. | 361/777 |
| 5,729,439 | * | 3/1998 | Saito | 257/786 |
| 5,925,445 | * | 7/1999 | Suzuki | 174/250 |
| 6,091,155 | * | 7/2000 | Jonaidi | 257/786 |

OTHER PUBLICATIONS

IBM Technical Bulletin, vol.34, NO.1, pp.465–466: UNIQUE PAD GEOMETRY FOR OPTIMUM SOLDER APPLICATION.*

* cited by examiner

Primary Examiner—Jayprakash N. Gandhi
Assistant Examiner—John B. Vigushin
(74) Attorney, Agent, or Firm—Jimmy L. Funke

(57) ABSTRACT

A method for controlling the height, shape and placement of solder connections of a surface mount circuit device, such as a flip chip, by way of controlling the extent to which solder is able to flow on a conductor during reflow, but without the conventional use of a solder mask in a manner that results in a portion of the mask remaining beneath the device. Each conductor is defined to include a bond pad and a reduced-width portion adjacent the bond pad. The width of each reduced-width portion is sufficiently narrower than the width of its adjacent bond pad to impede the flow of molten solder onto the reduced-width portion from a solder bump registered with the bond pad. As a result, when reflow soldering a circuit device to the circuit board, molten solder substantially remains on the bond pads and, for a given solder bump size, the bond pads determine the shape and height of the resulting solder connections.

20 Claims, 1 Drawing Sheet

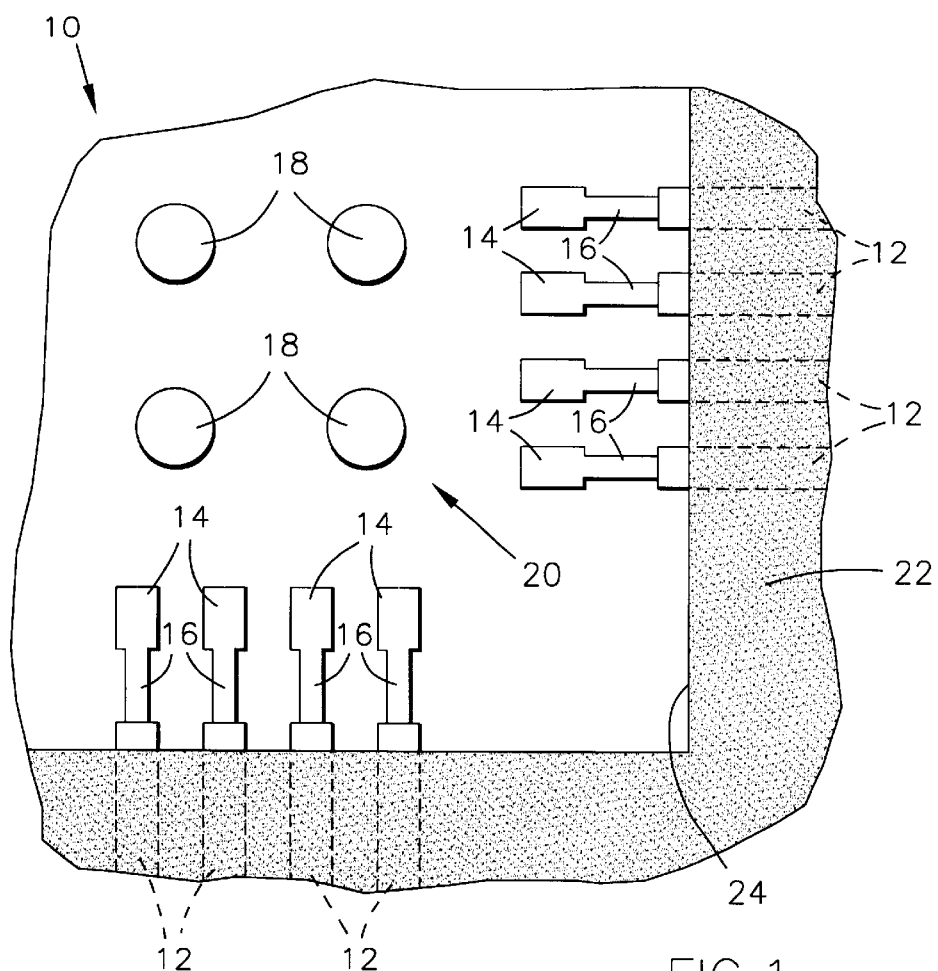
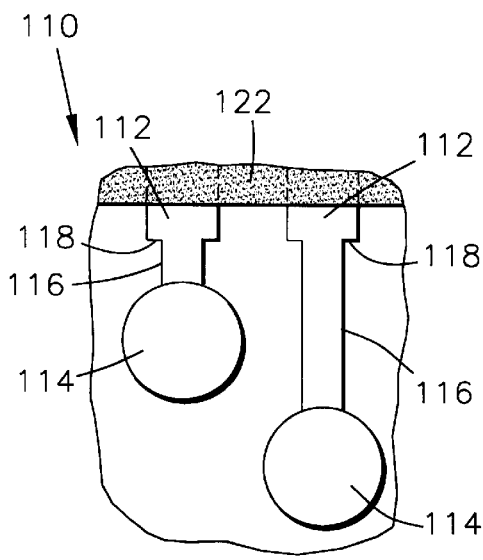
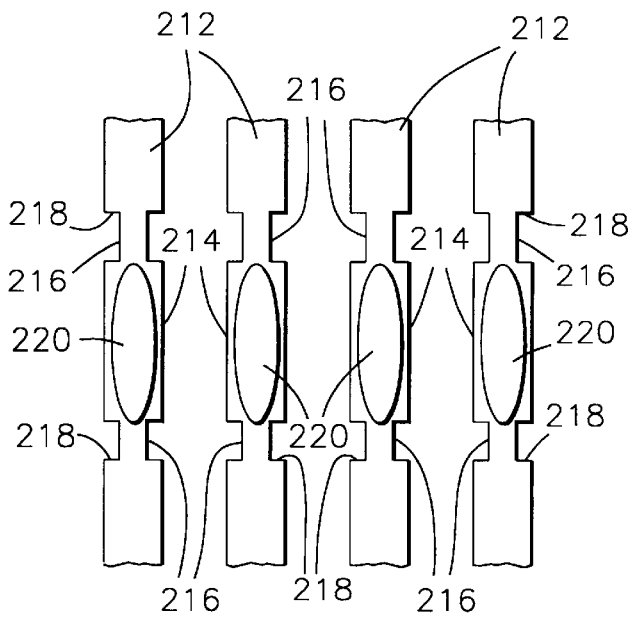
FIG.1
FIG.2
FIG.3

CONDUCTOR PATTERN FOR SURFACE MOUNT DEVICES AND METHOD THEREFOR

TECHNICAL FIELD

The present invention generally relates to surface mount (SM) circuit devices that are attached to conductor patterns with solder connections formed by reflow soldering methods. More particularly, this invention relates to a method for promoting the stand-off height of surface mount circuit devices on laminate circuit boards by controlling the height of their solder connections without the conventional use of a solder mask as a solder stop.

BACKGROUND OF THE INVENTION

A flip chip is generally a monolithic surface mount (SM) semiconductor device, such as an integrated circuit, having bead-like terminals formed on one of its surfaces. The terminals, typically in the form of solder bumps, serve to both secure the chip to a circuit board and electrically interconnect the flip chip circuitry to a conductor pattern formed on the circuit board, which may be a ceramic substrate, printed wiring board, flexible circuit, or a silicon substrate. Due to the numerous functions typically performed by the microcircuitry of a flip chip, a relatively large number of solder bumps is required. The solder bumps are typically located at the perimeter of the flip chip on electrically conductive pads that are electrically interconnected with the circuitry on the flip chip. The size of a typical flip chip is generally on the order of a few millimeters per side, resulting in the solder bumps being crowded along the perimeter of the flip chip.

Because of the narrow spacing between adjacent solder bumps and conductors, soldering a flip chip to its conductor pattern requires a significant degree of precision. Widely employed for this purpose are reflow soldering techniques, which typically entail precisely depositing a controlled quantity of solder on a flip chip using methods such as electrodeposition, and then heating the solder above its liquidus temperature to form the characteristic solder bumps on the surface of the chip. After cooling to solidify the solder bumps, the chip is soldered to the conductor pattern by registering the solder bumps with their respective conductors and then reheating, or reflowing, the solder so as to metallurgically adhere, and thereby electrically interconnect, each solder bump with its corresponding conductor, forming what will be referred to herein as a solder connection.

Placement of the chip and reflow of the solder must be precisely controlled not only to coincide with the spacing of the terminals and the size of the conductors, but also to control the height of the solder connections after soldering. As known in the art, controlling the height of solder connections after reflow is often necessary to prevent the surface tension of the molten solder from drawing the flip chip excessively close to the substrate during the reflow operation. Sufficient spacing between the chip and its substrate, termed the stand-off height, is desirable for allowing penetration of cleaning solutions for removing undesirable processing residues, promoting the penetration of mechanical bonding and encapsulation (underfill) materials between the chip and its substrate, and enabling stress relief of the solder connections during thermal cycles. Solder bump position and height are generally controlled by the amount of solder deposited on the flip chip to form the solder bump and by the use of solder stops that limit the surface area over which the solder bump is allowed to reflow. Solder stops are typically formed by a solder mask on laminate substrates and printed dielectric on ceramic substrates. For laminate circuit boards, the solder mask is applied over the conductor pattern and an opening is formed in the mask to expose a limited portion of each conductor, which then serves as a bond pad for the solder bumps.

While solder stops are widely used in the art, trends in the industry have complicated their ability to yield solder connections that provide an adequate flip chip stand-off height. As flip chips become more complex, the number of bumps that must be accommodated along the chip perimeter has increased. In turn, the conductors to which the bumps are registered and soldered have become more closely spaced and narrower, e.g., a pitch of about 0.010 inch (about 250 micrometers) or less and line widths of about 0.004 inch (about 100 micrometers), yielding a line spacing of about 0.006 inch (about 150 micrometers) or less. Fine solder bump and conductor pitches complicate the design and fabrication of solder stops, particularly on laminate substrates with the result that pitches of less than 0.010 inch have not been widely used. Solder connections having adequate stand-off height have also become more difficult to consistently produce, which increases the difficulty of removing residues from between the chip and substrate, underfilling the chip with bonding and encapsulation materials, and promoting stress relief in the solder connections during thermal cycling. This difficulty is particularly evident on laminate circuit boards, because the requirement for a solder mask as a solder stop requires that a portion of the mask remains beneath the chip, which reduces the stand-off height of the chip by the thickness of the mask. For example, on a fine pitch pattern of 0.010 inch, the height of each solder connection may be about 0.0036 inch (about 90 micrometers), but the stand-off height is only about 0.003 inch (about 75 micrometers) for a typical solder mask thickness of about 0.0006 inch (about 15 micrometers).

Accordingly, it would be desirable if a method were available that was able to increase the stand-off heights of flip chips and other surface mount devices, and particularly those devices requiring a fine pitch solder bump pattern.

SUMMARY OF THE INVENTION

The present invention provides a method for controlling the height, shape and placement of solder connections of a surface mount circuit device, such as a flip chip, by way of controlling the extent to which solder is able to flow on a conductor during reflow, but without the conventional use of a solder mask in a manner that results in a portion of the mask remaining beneath the device. As a result, solder connections formed by the method of this invention are able to achieve a greater stand-off height for the device, which promotes the penetration of cleaning solutions, mechanical bonding and encapsulation materials between the chip and its substrate, and enables stress relief during thermal cycles. Because bonding and encapsulation materials typically adhere better to circuit board materials than solder mask materials, another advantage of the invention is that underfill materials are able to bond directly to a circuit board rather than the mask.

According to this invention, the above is achieved by forming on a circuit board a conductor pattern defined by a number of conductors, with each of the conductors defining a bond pad and a reduced-width portion adjacent the bond pad. The width of each reduced-width portion is sufficiently narrower than the width of its adjacent bond pad to impede the flow of molten solder onto the reduced-width portion from a solder bump registered with the bond pad. As a result, when reflow soldering a circuit device to the circuit board, molten solder substantially remains on the bond pads and, for a given solder bump size, the bond pads determine the shape and height of the resulting solder connections. In this manner, the reduced-width portion of each conductor serves as a solder stop, because each reduced-width portion limits the flow of molten solder on the conductor.

In view of the above, a significant advantage of this invention is the elimination of the prior art requirement for conventional solder stops to limit the flow of solder on the conductors. On laminate circuit boards, the elimination of a solder stop eliminates the need for a solder mask that would otherwise lie between the circuit device and board and, as a result, would reduce the stand-off height of the device by the thickness of the mask. Accordingly, the stand-off height of a surface mount surface device on a laminate board is maximized for a given solder bump size, which promotes the penetration of cleaning solutions, mechanical bonding and encapsulation materials between the chip and its substrate, promotes the adhesion of bonding and encapsulation materials, and enables stress relief during thermal cycles.

Other objects and advantages of this invention will be better appreciated from the following detailed description.

BRIEF DESCRIPTION OF THE DRAWINGS

FIGS. 1, 2 and 3 are plan views of portions of circuit boards with conductor patterns in accordance with three embodiments of the present invention.

DESCRIPTION OF THE PREFERRED EMBODIMENT

Shown in FIG. 1 is a portion of a circuit board 10 in accordance with a first embodiment of this invention. Conductors 12 define a conductor pattern on the circuit board 10, with each conductor 12 configured in accordance with this invention to have a bond pad 14 delineated by a reduced-width portion 16 that separates the bond pad 14 from the remainder of the conductor 12. The circuit board 10 is shown prior to placement of a flip chip or other surface mount device on the board 10, by which solder bumps on the chip would be registered with and then reflowed on the bond pads 14. Optional "dummy bumps" 18 in accordance with commonly assigned U.S. Pat. No. 5,400,950 are shown within an interior region 20 of the circuit board 10 surrounded by the conductor pattern. These bumps 18 are not electrically active, but are used if additional mechanical lift is desired to promote the stand-off height of the chip on the board 10.

As typical in the art, after registration with the bond pads 14, the solder bumps of the chip are reflowed in any suitable manner to form solder connections that physically and electrically connect the chip to the conductors 12. Suitable solder alloys include, but are not limited to, tin-based, lead-based and indium-based alloys, with notable examples being tin-lead alloys containing about ten to about sixty percent tin, with possible alloying additions of antimony, silver, etc. These alloys can be reflowed at sufficiently low temperatures to avoid thermal damage to the circuitry of the chip and circuit board 10. The solder alloy for the bumps is typically screen printed or electrodeposited on contact pads on the chip, and must be accurately deposited in limited amounts such that, after reflow, the solder bumps will be substantially of equal size and will accurately and uniquely register with the bond pads 14 when the chip is registered with the conductors 12.

The conductors 12 are formed of a solderable material, which denotes a material to which solder will metallurgically bond and reliably adhere for purposes of making an electrical interconnection, as determined in the art using known test methods. A preferred conductor material for laminate circuit boards (e.g., FR4) is planar copper deposited by plating or by lamination of a copper foil, with a suitable thickness being about 0.015 to about 0.040 millimeters. While the invention has particular applicability for laminate circuit boards, conductors configured in accordance with this invention can be printed or otherwise formed on the surface of other circuit board materials, including ceramic and silicon substrates and flexible circuits, as is known in the art.

A solder mask 22 is shown as surrounding the bond pads 14, the reduced-width portions 16, and the interior region 20 of the circuit board 10. The solder mask 20 is preferably a photoresist material so that an opening 24 in the mask 22 can be defined by known photoengraving techniques. The opening 24 in the mask 22 would typically be required on a laminate circuit board to expose a limited portion of the conductors 12 for the purpose of defining the bond pads 14, resulting in the opening 22 being roughly a square-shaped trench corresponding to the square pattern formed by solder bumps located along the perimeter of a chip. However, in accordance with this invention, the solder mask 22 is excluded from the interior region 20 of the board 10, and the conductors 12 are truncated to define the interior end of each bond pad 14, while the opposite end of each pad 14 is delineated by the interface with its reduced-width portion 16.

According to the invention, the reduced-width portions 16 serve as solder stops by physically impeding the flow of molten solder beyond their respective bond pads 14, and preventing solder flow onto the remainder of the conductors 12 set apart from the bond pads 14 by the reduced-width portions 16. As the molten solder coalesces during reflow, the surface tension of the solder constrains the final shape of the solder connections formed by the bumps in accordance with the size and shape of the bond pads 14. Because the solder mask 22 is not required within the interior region 20, the stand-off height of a chip attached to the bond pads 14 by reflow soldering is effectively increased by the width of the solder mask 22. With this increase in stand-off height, the penetration of cleaning solutions, mechanically bonding and encapsulation materials is promoted during processing of the board 10, and stress relief of the solder connections is promoted during thermal cycling of the circuit board 10. Because bonding and encapsulation materials typically adhere better to circuit board materials than solder mask materials, another advantage of this invention is that underfill materials are able to bond directly to the circuit board 10 rather than the solder mask 22.

In view of the above, the transverse widths of the bond pads 14 and reduced-width portions 16 are critical to achieving the objects of this invention, while the width of the remainder of each conductor 12 is not. Because the surface area of each bond pad 14 determines the manner in which the molten solder will flow, the length of each bond pad 14 is important, while the length of each reduced-width portion 16 should be sufficient to prevent molten solder from flowing over the portion 16 and onto the remainder of the conductor 12. The square corners shown in FIG. 1 at the junction between each bond pad 14 and its reduced-width portion 16 improve the ability of the portion 16 to impede the flow of solder across the junction. In practice, the surface areas, widths and lengths of the bond pads 14 are preferably the same, as are the widths and lengths of the reduced-width portions 16. To be sufficiently narrower than its bond pad 14 for the purpose of effectively impeding the flow of molten solder, the maximum width for a reduced-width portion 16 should be about 75% the width of its bond pad 14, and preferably about 40% to about 70% of the width of the bond pad 14. As an example, for conductors 12 on a 0.008 inch pitch (200 micrometers), a suitable length and width for a bond pad 14 is about 0.007 inch (about 175 micrometers) and about 0.004 inch (about 100 micrometers), respectively, a suitable length for each reduced-width portion 16 is about 0.007 inch (about 175 micrometers), and a maximum width for each reduced-width portion 16 is believed to be about 0.003 inch (about 76 micrometers), with a suitable width being about 0.002 inch (about 50 micrometers).

The bond pads 14 of FIG. 1 are shown as being rectangular and linearly aligned on the circuit board 10. As a result, solder connections formed on the bond pads 14 will generally have an oblong shape whose major axis is in the longitudinal direction of each conductor 12.

In a second embodiment of the invention shown in FIG. 2, conductors 112 are formed to have circular bond pads 114 set apart from the remainder of each conductor 112 by, a reduced-width portion 116 whose intersection with the conductor 112 defines a square transverse edge 118. The bond pads 114 are arranged in a staggered pattern on a circuit board 110 as a result of adjacent reduced-width portions 116 having different lengths. To maximize the spacing between circular-shaped solder connections subsequently formed at each bond pad 114, pads 114 with shorter reduced-width portions 116 are preferably aligned adjacent to the reduced-width portions 116 of adjacent conductors 112, as depicted in FIG. 2. In this embodiment, the maximum width of each reduced-width portion 116 is about 50% of the diameter of its bond pad 114, and preferably about 33% to about 42% of the diameter of the pad 114. As an example, for conductors 112 on a 0.008 inch pitch (200 micrometers), a suitable diameter for a bond pad 114 is about 0.006 inch (about 150 micrometers), and a maximum width for each reduced-width portion 116 to adequately impede the flow of molten solder is believed to be about 0.003 inch (about 76 micrometers), with a suitable width being about 0.0025 inch (about 63.5 micrometers). To produce the desired staggered arrangement of the pads 114, the lengths of adjacent reduced-width portions 116 preferably differ by the diameter of the bond pads 114. e.g., about 0.006 inch (about 175 micrometers) for the pattern just described. It is foreseeable that the pads 114 could be staggered greater distances apart, with the maximum length of each reduced-width portion 116 generally being limited by the allowable temperature rise and resistance increase of its conductor 112.

As with the embodiment of FIG. 1, a solder mask 122 is shown as being limited to surrounding the bond pads 114 and reduced-width portions 116 of the conductors 112. The solder mask 122 is excluded from the interior region of the circuit board 110 surrounded by the bond pads 114, where the mask 122 would conventionally be required as a solder stop, and instead the reduced-width portions 116 serve as solder stops by physically impeding the flow of molten solder beyond the bond pad 114, and preventing solder flow onto the remainder of the conductors 112 set apart from the bond pads 114 by the reduced-width portions 116. The benefit of excluding the solder mask 122 from the interior region of the board 110 is again the increased stand-off height of a chip attached to the bond pads 114 by reflow soldering. An additional benefit of the embodiment of FIG. 2 is that the staggered arrangement of solder connections on the bond pads 114 provides for greater clearance between connections for a given conductor pitch, which reduces the risk of shorts when fine conductor pitches (e.g., 0.010 inch or less) are used.

A third embodiment of this invention is shown in FIG. 3, in which conductors 212 have bond pads 214 defined between pairs of reduced-width portions 216, each of which intersects its conductor 212 to define a square transverse edge 218. The length and width of each reduced-width portion 216 is again sized to prevent molten solder from flowing across the portion 216 and onto the remainder of the conductor 212, as indicated by the solder connections 220 depicted in FIG. 3. As with the previous embodiments of FIGS. 1 and 2, a solder mask is not used to delineate the bond pads 214, and therefore can be excluded from beneath a flip chip attached to the bond pads 214 with the solder connections 220. Similar to the embodiment of FIG. 1, a maximum width for a reduced-width portion 216 is about 75% of the width of its bond pad 214, and preferably about 40% to about 70% of the width of the pad 214. An example of suitable dimensions for conductors 212 configured in accordance with FIG. 3 are, for a conductor pitch of about 0.008 inch (about 200 micrometers), bond pad lengths and widths of about 0.007 inch (about 150 micrometers) and about 0.004 inch (about 100 micrometers), respectively, and lengths and widths for the reduced-width portions 216 of about 0.002 inch (about 50 micrometers).

While the invention has been described in terms of a preferred embodiment, it is apparent that other forms could be adopted by one skilled in the art. Accordingly, the scope of the invention is to be limited only by the following claims.

What is claimed is:

1. A circuit board comprising a plurality of conductors that define a conductor pattern on the circuit board, each of the conductors being formed of a solderable material that defines a bond pad and a reduced-width portion adjacent the bond pad, the circuit board further comprising a quantity of solder material substantially limited to the bond pad and substantially excluded from the reduced-width portion, each bond pad and its corresponding reduced-width portion have widths in a transverse direction, the width of each reduced-width portion being sufficiently narrower than the width of its bond pad so as to impede the solder material when molten from flowing onto the reduced-width portion.

2. The circuit board set forth in claim 1, wherein the bond pads have substantially equal areas and each of the bond pads has a rectangular or circular shape.

3. The circuit board set forth in claim 1, wherein each of the bond pads has a rectangular shape and the width of each of the reduced-width portions is not more than 75% the width of the bond pads.

4. The circuit board set forth in claim 1, wherein each of the bond pads has a circular shape and the width of each of the reduced-width portions is not more than 50% the width of the bond pads.

5. The circuit board set forth in claim 1, wherein the conductor pattern surrounds a portion of the circuit board, and wherein a solder mask does not overlie the portion of the circuit board surrounded by the conductor pattern.

6. The circuit board set forth in claim 1, wherein the bond pads of the conductors are staggered, so that the bond pad of each of the conductors is laterally adjacent the reduced-width portion of an adjacent one of the conductors.

7. The circuit board set forth in claim 1, further comprising a circuit device attached to the bond pads with the solder material.

8. The circuit board set forth in claim 7, wherein the solder material forms solder connections that do not contact the reduced-width portions.

9. The circuit board set forth in claim 8, wherein the solder connections have substantially oblong cross-sections.

10. A circuit board comprising:

conductors that define a conductor pattern on the circuit board, the conductor pattern surrounding a portion of the circuit board that is free of a solder mask, each of the conductors being formed of a solderable material that defines a first portion, a bond pad, and a reduced-width portion between the first portion and the bond pad, each first portion, reduced-width portion and bond pad of each conductor having a width in a transverse direction of the conductor, the width the reduced-width portion being narrower than the widths of the first portion and the bond pad, the width of each reduced-width portion being sufficiently narrower than the width of its bond pad so as to prevent the flow of molten solder onto the first portion from a solder bump registered with the bond pad;

a circuit device mounted to the circuit board; and solder substantially limited to the bond pads and substantially excluded from the reduced-width portions of the conductors, the solder defining solder connections attaching the circuit device to the bond pads, the solder connections not contacting the first portions of the conductors.

11. The circuit board set forth in claim 10, wherein each of the bond pads has a rectangular shape and the width of each of the reduced-width portions is not more than 75% the width of the bond pads.

12. The circuit board set forth in claim 10, wherein each of the bond pads has a circular shape and the width of each of the reduced-width portions is not more than 50% the width of the bond pads.

13. The circuit board set forth in claim 10, wherein the solder connections have substantially circular cross-sections.

14. The circuit board set forth in claim 10, wherein the solder connections have substantially oblong cross-sections.

15. A method comprising the steps of:

forming a plurality of conductors that define a conductor pattern on a circuit board, each of the conductors being formed of a solderable material that defines a bond pad and a reduced-width portion adjacent the bond pad;

mounting a circuit device to the circuit board so that solder bumps on the circuit device register with the bond pads of the conductors;

reflowing the solder bumps, each of the reduced-width portions having a width that is sufficiently narrower than its corresponding one of the bond pads so as to impede the flow of molten solder onto the reduced-width portion from the solder bump registered with the bond pad; and then solidifying the molten solder to form solder connections that are substantially limited to the bond pads and substantially excluded from the reduced-width portions of the conductors.

16. The method set forth in claim 15, wherein each of the conductors further comprises a first portion separated from the bond pad thereof by the reduced-width portion thereof, the width of the reduced-width portion being narrower than the first portion, the reduced-width portion preventing the flow of the molten solder onto the first portion from the solder bump registered with the bond pad during the reflow step.

17. The method set forth in claim 15, wherein each of the bond pads has a rectangular shape and the width of each of the reduced-width portions is not more than 75% the width of the bond pads.

18. The method set forth in claim 15, wherein each of the bond pads has a circular shape and the width of each of the reduced-width portions is not more than 50% the width of the bond pads.

19. The method set forth in claim 15, wherein the conductor pattern is formed so as to surround a portion of the circuit board, and wherein a solder mask does not overlie the portion of the circuit board surrounded by the conductor pattern.

20. The method set forth in claim 15, wherein the solder connections do not contact the reduced-width portions following the reflow step.

\* \* \* \* \*